(12) United States Patent
Gau

(10) Patent No.: US 6,738,882 B1
(45) Date of Patent: May 18, 2004

(54) CONCURRENT MULTI-PROCESSOR MEMORY TESTING BEYOND 32-BIT ADDRESSES

(75) Inventor: Donald G. Gau, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 09/451,052

(22) Filed: Nov. 30, 1999

(51) Int. Cl.⁷ .......................... G06F 12/16; G11C 29/00
(52) U.S. Cl. .................... 711/170; 711/202; 714/53; 714/702; 714/763
(58) Field of Search ................ 711/170, 154, 711/165, 202, 104, 102, 103; 714/42, 53, 701, 702, 721, 723, 763, 764

(56) References Cited

U.S. PATENT DOCUMENTS

| | | | | |
|---|---|---|---|---|
| 4,926,316 A | * | 5/1990 | Baker et al. | 711/2 |
| 5,109,521 A | * | 4/1992 | Culley | 711/165 |
| 5,537,540 A | * | 7/1996 | Miller et al. | 714/38 |
| 5,960,468 A | * | 9/1999 | Paluch | 711/219 |
| 6,070,207 A | * | 5/2000 | Bell | 710/302 |
| 6,105,101 A | * | 8/2000 | Hester et al. | 710/260 |

* cited by examiner

*Primary Examiner*—Matthew Kim
*Assistant Examiner*—Matthew D. Anderson

(57) ABSTRACT

Memory about 4 Gbytes is tested using a DOS diagnostics program that remaps memory to a 32-bit addresses. In some embodiments, memory above 3 Gbytes is tested in 1 Gbyte blocks until the end of memory is reached using a physical address extension that extends addresses from 32 bits to 36 bits. Testing is done concurrently by all processors.

6 Claims, 2 Drawing Sheets

CONCURRENT MULTI-PROCESSOR MEMORY TESTING BEYOND 32-BIT ADDRESSES

BACKGROUND AND SUMMARY OF THE INVENTION

This application relates to computer diagnostics, specifically, testing of computer memory above 4 Gbytes.

Computer data storage capability has expanded greatly in recent years. Testing the integrity of memory subsystems is done by comprehensive computer diagnostics programs, of which memory testing is just a part. These programs verify the integrity and reliability of the bus and memory chips. As memory expands, these programs require fast and reliable access to the ever-increasing addresses within the memory.

Physical memory is the memory that a processor addresses on its bus. In protected mode, a Pentium Pro processor has $2^{36}$ bytes (64 Gbytes) of physical address space. However, the processor instructions only allow access to the address space from zero to 4 Gbytes. Each byte of memory storage is assigned a unique address from zero to $2^{36}-1$, called a physical address. This address space is flat, or unsegmented.

Segmentation and paging are memory management facilities that allow memory to be managed efficiently. When employing the processor's memory management facilities, programs do not directly address physical memory. Instead, they access memory using any of three memory models: flat, segmented, or real-address mode. In the flat memory model, memory appears to a program as a single continuous address space called linear address space. Code, data, and the procedure stack are all contained in this address space. The linear address space is byte addressable, with addresses running up to $2^{32}-1$. An address for any byte in the linear address space is called a linear address.

In the segmented memory model, memory is grouped into independent address spaces called segments. In this model, code, data, and stacks are typically contained in separate segments. To address a byte in a segment, a program must issue a logical address, which consists of a 16-bit segment selector and a 32-bit offset. The segment selector identifies the segment to be accessed and the offset identifies a byte in the address space of the segment. The processor maps every logical address into a linear address within the linear address space.

If paging is not used, the processor maps linear addresses into physical addresses. If paging is used, a second level of address translation is used to translate the linear address into a physical address.

Paging, also called virtual memory, allows the processor to map a linear address into a smaller physical address space and disk storage. The processor divides the linear address space into 4 kbyte, 2 Mbyte, or 4 Mbyte size pages that can be mapped into physical memory or disk storage. When a program references a logical address, the processor translates the logical address into a linear address. It then uses the paging mechanism to translate the linear address into a corresponding physical address. The processor uses information from page directories and page tables to map linear addresses into physical address space.

Physical address extension enables an extension of the physical address space in the Pentium processor from 32-bits to 36-bits. The processor provides 4 added address line pins to accommodate the additional address bits. Paging must be enabled to use physical address extension. Both the PG flag in the register CR0 and the PAE flag in register CR4 must be set.

The physical address extension enables the processor to allow two sizes of paging: 4 kbyte and 2 Mbyte. Both page sizes can be addressed within the same set of paging tables, which means a page-directory entry can point to either a 2 Mbyte page or to a page table that in turn points to 4 kbyte pages. To support the 36-bit physical addresses, several changes are made to the paging data structures. The paging table entries are increased to 64 bits to accommodate the 36-bit base physical addresses. Each 4 kbyte page directory and page table can thus have up to 512 entries. A new table, called the page directory pointer table, is added to the linear address translation hierarchy. This table has 4 entries of 46 bits each, and lies above the page directory in the hierarchy. The page directory pointer table takes up 64 bits with some bits being reserved. With the physical address extension mechanism enabled, the processor supports up to 4 page directories. The 20 bit page directory base address in register CR3 points to a 24 bit page-directory-pointer-table base address. This field provides the 24 most significant bits of the physical address of the first byte of the page directory pointer table, which forces the table to be located on a 4 kbyte boundary. Also, the linear address translation is changed to allow mapping 32 bit linear addresses into the larger physical address space.

Presently, most operating systems do not allow access to memory addresses above 32-bits, or 4 Gbytes. There is currently a need in the art for the ability to test memory above 4 Gbytes, as computers grow in speed, power, and size.

Remapping Memory for Concurrent Multi-processing

If the diagnostics diskette is loaded in the computer at startup, the computer will boot to DOS (or another low level operating system that allows the processor modes to be altered) instead of its normal operating system (usually a version of Windows). Thus, instead of automatically setting the processors to protected mode, they are set to real mode. From real mode, processor control registers can be used to set the processors to protected mode with the paging mechanism and physical address extension enabled, which allows extended paging. Extended paging allows 36-bit addresses to be remapped to any 32-bit address. This allows the processors to set up page tables so that memory above 4 Gbytes can be remapped to any address. By taking advantage of extended paging during diagnostics, all processors can be dispatched to concurrently test all memory, including memory above 32-bit addresses. This memory is tested in blocks by mapping, for example, a 1 Gbyte block of memory with 36-bit addresses (i.e., memory above 4 Gbytes) into 32-bit addresses. This remapping is done by setting the page tables through which the processors address memory. By directing the page tables to higher blocks of memory (blocks above 4 Gbytes), the processors can address this memory with the existing 32-bit addresses.

In the preferred embodiment, the processor is booted from a DOS 6.2 diskette, and diagnostics are executed. The program places the processor in protected, paging, and physical address extension modes. All memory above 3 Gbytes is tested in 1 Gbyte blocks, until the end of memory. Note that the selection to remap memory above 3 G,bytes is arbitrary, as is the selection of testing in 1 Gbyte blocks. All memory could be remapped, only memory above 1 Gbyte could be remapped, etc. The 3 Gbyte threshold is selected for convenience, and because of the "memory gap" present in some systems, which causes some memory below 4 Gbytes to be unusable. Alternatively, a 64-bit start and end address may be specified to test a specific range of memory if desired.

In the presently preferred embodiment, the system processors are directed to the same 1 Gbyte block of memory. They divide this memory among them, run the testing algorithms, and switch sections of memory, continuing testing until the entire block of memory has been tested by all processors. Then the processors are allocated a new block of memory for testing, and the process repeats. When the entire memory test is complete, the program sets the processors back to real mode and returns to DOS control.

Note that, in the preferred embodiment, the diagnostics diskette boots into DOS version 6.2. This permits the processor modes to be properly set, as discussed above. However, a more general consideration is that DOS is a lower level, cruder, and more robust operating system that any of the Microsoft Windows (™) operating systems. The Windows operating system is a "seamless web," which takes control of many system settings, including some memory mapping and page table functions.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
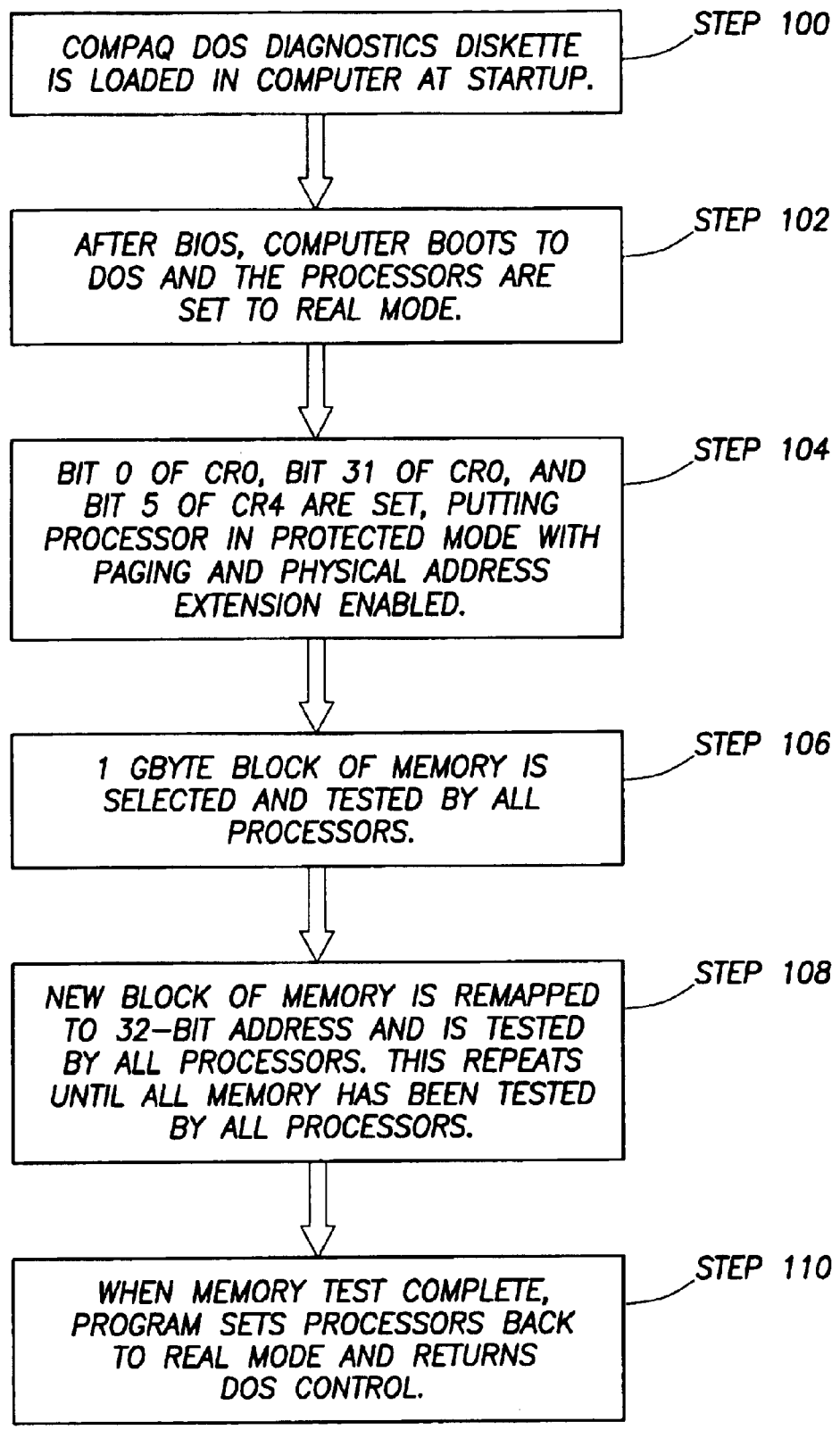
FIG. 1 shows a flowchart of the presently preferred embodiment.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

When a computer finishes its BIOS, a diagnostics program may be run from a diskette, before or instead of launching the main operating system. In the presently preferred embodiment, the Compaq DOS Diagnostics program boots the computer in DOS 6.2 rather than Windows. In DOS, the processors execute in real mode. In real mode, no blocks of memory are protected, and the various applications have no protected allocation of memory.

There are four processor modes: real-address (real mode), protected mode, system management mode, and virtual-8086 mode. Upon power up, the processor starts up in real mode where memory is accessed using two 16-bit values, the segment and the offset. The segment points to a memory paragraph that is aligned on a 16 byte boundary. The accessible memory range therefore goes from 0000:0000h to 0FFFF:FFFFh. The upper segment/offset address translates into a linear address of 0010FFEFh, which is a little less than 64k beyond the 1M address. In the past, memory beyond this limit was accessed by setting the processor in flat-mapped mode. (This mode is not documented by Intel, but is well known by those skilled in the relevant art.)

Internally in the processor, allowable address ranges are defined for each register that holds a segment value. On power up, the default is a 16-bit offset, or 64k. These limits are redefined to a full 32 bits, or 4 Gbytes, so memory is accessed by a 16-bit segment and a 32-bit offset. Though this mechanism works fine for testing memory from zero to 4 Gbytes, the cache must either be enabled (which allows minimum test time, but tests cache memory and not main system memory) or disabled (which tests main memory directly, but does so slowly because instructions must constantly be fetched from memory). The processor can therefore be set to protected mode with paging enabled, which allows enabling or disabling of the cache in different memory regions. For example, the cache can be enabled where the code lives, and disabled where memory is tested. Another benefit is the physical address extension, which uses a different page table structure to access all 36 bits of physical memory.

The control registers of the processors define the configuration. Once Windows sets the processors in protected mode, these control registers cannot be changed. Setting the processors in real mode allows their operating mode to be changed. This allows the Compaq DOS Diagnostics program to take advantage of the extended paging mechanism of Intel processors. The paging mechanism allows the processors to set up page tables so that the processors can access certain blocks of memory. These can be altered, allowing a processor to access any specific block of memory at a given time. The processors access to given memory blocks is changed by altering the page table that assigns memory to that processor.

Using the paging mechanism and the physical address extension (PAE) of the Intel processors allows all processors to be dispatched to test all memory concurrently. When paging is enabled, the PAE allows the processors to use their page tables to address memory greater than 32-bit addresses. Thus, a 1 Gbyte block of memory at, for example, the 5 Gbyte addresses (which would be 36-bit addresses) can be remapped to, for example, the 2 Gbyte address space (32-bit addresses). The processor can then use its 32-bit address test algorithms to verify that block of memory.

In the preferred embodiment, the processors are dispatched to test all memory concurrently. The first 3 Gbytes of memory are tested normally, without remapping. Then, higher blocks of memory are mapped to the second Gbyte of address space using extended paging. This is done for all processors, which will be set to address the same 1 Gbyte block of memory concurrently. This block of memory is allocated among them, and the testing algorithms are run until the entire block of memory has been individually tested by all processors. Then, another block of memory is remapped to the 2 Gbyte address space, and the testing is repeated until all memory (up to 64 Gbytes for Intel processors) is tested. Note that the choice of when to remap memory may vary, as might the choice of what memory block size to use when testing.

FIG. 1 shows a flowchart of the memory testing process. In step 100, the Compaq Diagnostics diskette is loaded in the computer at startup, so that the computer will boot to DOS instead of Windows after running its BIOS. When the computer boots to DOS, the processors are set to real mode (step 102). The diagnostics program sets the processor to protected mode, with paging and physical address extension enabled. (step 104). Protected mode operation, the paging mechanism, and physical address extension are all built into the processor. The processor is set to these modes by setting bits in the Control Registers. Bit 0 of Control Register CR0 sets the processor in protected mode. Bit 31 of Control Register CR0 sets the processor in paging mode. Bit 5 of Control Register CR4 sets the processor in extended paging mode, or physical address extension. This last mode must have Bit 31 of Control Register CR0 set, and it allows the paging mechanism to reference 36-bit addresses as opposed to only 32-bit addresses when the bit is not set.

Next, all memory (up to 64 Gbytes) is tested by each processor in 1 Gbyte blocks (step 106). The same block of memory is allocated to all testing processors, which divide the block up and concurrently test it. If the block has a 32-bit address, this address can be used to access the memory. If the block has a 36-bit address, the memory block is remapped to within a 32-bit address. Memory with addresses below the 32-bit threshold may also be remapped to another 32-bit address space. When the present, block of memory is tested by all processors, another block of memory is remapped to within the 32-bit address space, and the testing is repeated for the new block. This process is repeated until all desired memory is tested (step 108). When the memory test is complete, the diagnostics program sets the processors back to real mode and returns DOS control (step 110).

Memory below 4 Gbyte may be tested using the protected normal paging modes with the usual 32-bit memory access instructions. By using the protected extended paging modes for the Compaq DOS Diagnostics program, memory can be mapped anywhere in the 32-bit address space, allowing memory of up to 36-bit addresses (64 Gbytes) to be tested, the maximum addressable by Intel processors. The choice of memory block size to be tested is arbitrary, and any size can be used.

In the preferred embodiment, the first 3 Gbytes of memory are tested in normal mode, without remapping or extended paging. Remapping is only required to test memory above 32-bit addresses, or 4 Gbytes, but can be used to remap any memory, including that with 32-bit addresses. However, since some server systems have a memory gap (making some of the 4 Gbyte space unusable), only the first 3 Gbytes are tested in normal mode, and higher blocks are tested with extended paging. The diagnostics program is able to write data patterns to any 1 Gbyte block of memory from 0 to 64 Gbytes, and verify these data patterns. Users can specify any 64-bit start and end address to test specific address ranges using this testing method. Compaq DOS Diagnostics software provides a 64-bit data structure that allows 64-bit addresses.

Figure 2:
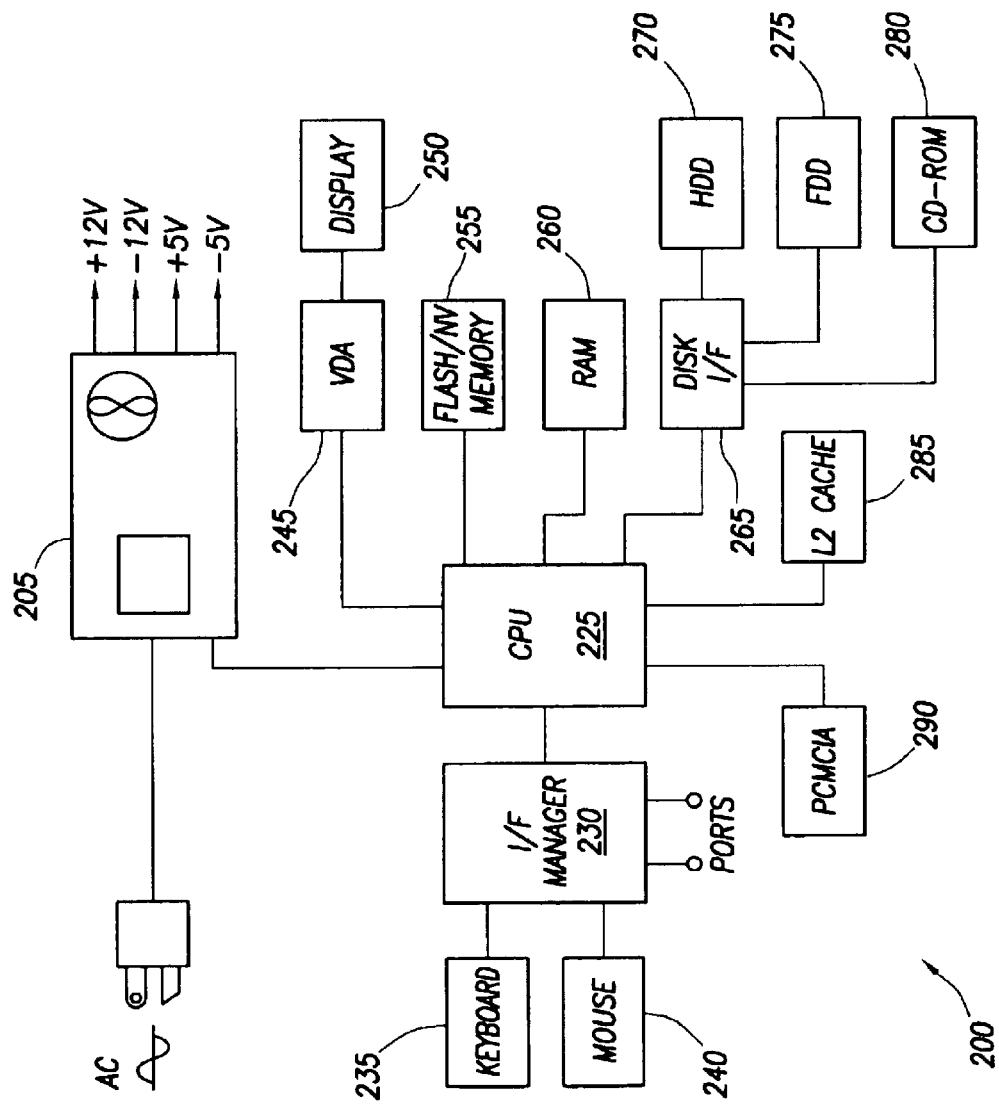
FIG. 2 shows a block diagram of a computer system according to the preferred embodiment.

FIG. 2 shows a block diagram of a basic computer system 200, and shows the relationships between the various components. In this example, the computer system includes:
user input devices (e.g. keyboard 235 and mouse 240);
a central processing unit (CPU) 225 which may consist of several microprocessors, and which is operatively connected to receive inputs from said input device, through an interface manager chip 230 (which also provides an interface to the various ports);
a power supply 205 which is connected to draw power from AC mains and provide DC voltage to the computer system 200 components;
a memory (e.g. flash or non-volatile memory 255 and RAM 260), which is accessible by the microprocessor;
a data output device (e.g. display 250 and video display adapter card 245) which is connected to output data generated by microprocessor; and
a magnetic disk drive 270 which is read-write accessible, through an interface unit 265, by the microprocessor.

Optionally, of course, many other components can be included, and this configuration is not definitive by any means. For example, the computer may also include a CD-ROM drive 280 and floppy disk drive ("FDD") 275 which may interface to the disk interface controller 265. Additionally, L2 cache 285 may be added to speed data access from the disk drives to the microprocessor, and a PCMCIA 290 slot accommodates peripheral enhancements.

Figure 3:
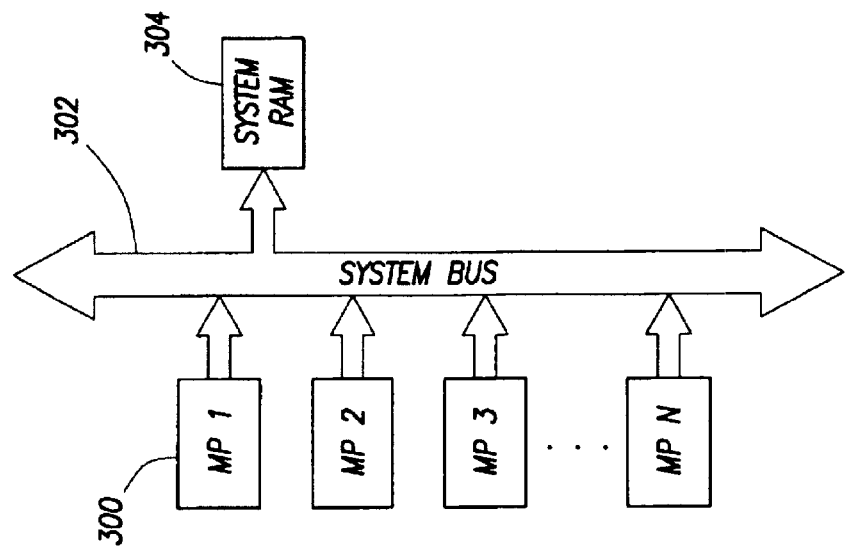
FIG. 3 shows a multiprocessor architecture.

FIG. 3 shows a block diagram of a multi-processor architecture. The microprocessors 300 are labeled MP1, MP2, MP3, and MPN, representing an arbitrary number of microprocessors connected to a system bus 302. The bus connects the processors to system RAM 304.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Operating system: a set of programs controlling the operations of a computer system, such as assemblers or input and output facilities.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

In one class of embodiments, DOS is replaced by a different operating system. The present application contemplates any operating system that allows the processor modes to be set to allow remapping of memory to an acceptable address range for diagnostics purposes regardless of the magnitude of the available addresses. For instance, future processors may be able to access 64-bit addresses, and remap memory from 128-bit addresses into a 64-bit address range for testing purposes.

Alternatively, memory from within the already accessible 32-bit addresses may be remapped as part of the testing program. Remapping of memory is therefore not limited only to memory above 32-bit addresses. Any diagnostics program that remaps memory to accommodate processor limitations is within the scope of the present application.

Additional general background, which helps to show the knowledge of those skilled in the art regarding the system context, and of variations and options for implementations, may be found in the following publications, all of which are hereby incorporated by reference. In particular, many details may be found in the books from MindShare, Inc., including PROTECTED MODE SOFTWARE ARCHITECTURE, CARD BUS SYSTEM ARCHITECTURE, EISA SYSTEM ARCHITECTURE, ISA SYSTEM ARCHITECTURE, 80486 SYSTEM ARCHITECTURE, PENTIUM PROCESSOR SYSTEM ARCHITECTURE, PCMCIA SYSTEM ARCHITECTURE, PLUG AND PLAY SYSTEM ARCHITECTURE, PCI SYSTEM ARCHITECTURE, USB SYSTEM ARCHITECTURE, and PENTIUM PRO PROCESSOR SYSTEM ARCHITECTURE, all of which are hereby incorporated by reference, and in the PENTIUM PROCESSOR FAMILY DEVELOPER'S MANUAL 1997, the MULTIPROCESSOR SPECIFICATION (1997), the INTEL ARCHITECTURE OPTIMIZATIONS MANUAL, the INTEL ARCHITECTURE SOFTWARE DEVELOPER'S MANUAL, the PERIPHERAL COMPONENTS 1996 databook, the PENTIUM PRO PROCESSOR BIOS WRITER'S GUIDE (version 2.0, 1996), and the PENTIUM PRO FAMILY DEVELOPER'S MANUALS from Intel, all of which are hereby incorporated by reference.

What is claimed is:

1. A computer system, comprising:

a user input device, a plurality of microprocessors, random-access memory which is connected to be read/write accessible by said microprocessors;

a diagnostics program on said computer system that tests and verifies data in said random-access memory;

wherein said plurality of processors are capable of being configured in a real-address mode permitting m-bit addresses that define a threshold address size or a physical address extension mode permitting n-bit addresses where n is greater than m;

wherein said diagnostics program configures said microprocessors to enable random-access memory testing above the threshold address size by remapping the random-access memory to address space below said threshold address size and causing the plurality of microprocessors to operate in the physical address extension mode; and wherein said plurality of microprocessors concurrently test said remapped random-access memory.

2. The computer system of claim 1, wherein the remapping enables the microprocessors to access the random-access memory above 4 Gbytes.

3. The computer system of claim 1, wherein a start address and an end address determine a range of random-access memory tested.

4. The computer system of claim 1 wherein the computer system has at least two operating systems, one operating system being used when the diagnostics program is not running and another operating being used when the diagnostics program is running.

5. A method of testing memory on a computer system also having a plurality of microprocessors, comprising:

configuring the microprocessors to enable remapping of the memory;

testing said memory in blocks concurrently by the microprocessors up to a threshold address size defined by an m-bit address mode;

remapping a section of memory above the threshold address size to address space below said threshold using an n-bit address mode; and testing said section of memory concurrently by the microprocessors using the n-bit address mode.

6. The method of claim 5 further comprising booting the computer to a first operating system when not testing said memory and booting to a second operating system, different from the first operating system, when testing said memory.

* * * * *